United States Patent [19]

Sawaya

[11] Patent Number: 5,191,511
[45] Date of Patent: Mar. 2, 1993

[54] SEMICONDUCTOR DEVICE INCLUDING A PACKAGE HAVING A PLURALITY OF BUMPS ARRANGED IN A GRID FORM AS EXTERNAL TERMINALS

[75] Inventor: Hiromichi Sawaya, Kawasaki, Japan

[73] Assignee: Kabushiki Kaisha Toshiba, Kawasaki, Japan

[21] Appl. No.: 830,892

[22] Filed: Feb. 4, 1992

[30] Foreign Application Priority Data

Feb. 8, 1991 [JP] Japan .................. 3-18026

[51] Int. Cl.$^5$ .............................. H05K 7/20
[52] U.S. Cl. ................... 361/383; 361/381; 361/386; 361/388; 361/401; 174/16.3; 165/80.3; 257/693; 257/700; 257/737; 257/713
[58] Field of Search ............. 361/380, 381, 383, 386, 361/388, 389, 395, 400, 401, 403, 405, 406, 408; 165/185, 80.3; 357/71, 80, 81; 174/16.3

[56] References Cited

FOREIGN PATENT DOCUMENTS 0117111 8/1984 European Pat. Off. .

OTHER PUBLICATIONS

Patent Abstracts of Japan vol., 9, No. 110, May 15, 1985; and Japanese Patent Document No. 60-000759. "Development of Small Size Ceramic CCB PGA with Hi-Thermal Conductivity", The Institute of Electronics, Information and Communication Engineers (Integrated Circuit), Dec. 12, 1991 issue.

Primary Examiner—Leo P. Picard
Assistant Examiner—Y. Whang
Attorney, Agent, or Firm—Finnegan, Henderson, Farabow, Garrett and Dunner

[57] ABSTRACT

A package is formed of a plurality of laminated insulation plates respectively having windows formed in the central portions thereof. Metallized patterns are formed on the surface of at least one of the insulation plates. The semiconductor chip is received in a space defined by the windows of the insulation plates. The semiconductor chip and the metallized patterns are electrically connected to each other via bonding wires. Bumps are arranged as external terminals of the semiconductor chip in a grid form on the surface of one of the insulation plates which lies on the rear surface side of the package. The bumps are electrically connected to the metallized patterns via through holes formed in the insulation plates.

7 Claims, 2 Drawing Sheets

SEMICONDUCTOR DEVICE INCLUDING A PACKAGE HAVING A PLURALITY OF BUMPS ARRANGED IN A GRID FORM AS EXTERNAL TERMINALS

BACKGROUND OF THE INVENTION

1. Field of the Invention

This invention relates to the construction of a package of a semiconductor device, and more particularly to a package on which a large number of external terminals are arranged.

2. Description of the Related Art

A Pin Grid Array (PGA) package is known as a package having a large number of external terminals arranged therein. The PGA package is a package having pin-shaped external terminals arranged at regular intervals in a grid form on the rear surface of the package body and formed to vertically project from the rear surface thereof. The semiconductor device using the PGA package is mounted on a printed circuit board having through holes formed therein. In an actual case, the external terminals (external pins) of the PGA package are inserted into the through holes of the printed circuit board and soldered.

In recent years, in the PGA package, the number of external pins has been increased in order to attain more complicated multifunctions and a larger added value of the semiconductor device. When the number of external pins becomes as high as several hundreds, the size of the PGA package becomes significantly large. When the size of the PGA package becomes large with an increase in the number of pins, there may occur problems in that the cost of the package body is raised, the weight thereof is increased, and the electrical characteristics are degraded (for example, the signal transmission distortion and the power source noise are increased) by an increase in inductance, capacitance and resistance components with an increase in the length of wirings in the package.

In a case where the size of the package body is reduced in order to suppress the influence of the above problems, it becomes important to reduce the pitch of the external pins. Since it becomes necessary to reduce the pin diameter with a decrease in the pitch, the external pins are liable to be bent at the time of the mounting of the package body on the printed circuit board, the mounting precision of the external pins cannot be enhanced, and the mounting operation becomes difficult. Further, when the pin diameter is reduced, it becomes, necessary for the manufactures of the packages to effect visual inspection of all of the products so as to check whether or not the external pins are bent or the products satisfy the specification, giving a bad influence on mass-productivity and increasing the manufacturing cost. When the pin diameter is reduced, a bridge of the solder may be made at the time of mounting of the external pins on the printed circuit board.

Thus, the conventional PGA package has various problems when the number of external pins is increased. Further, in a case where the PGA package is inserted into the through hole formed in the printed circuit board and mounted on the printed circuit board, it becomes difficult to reduce the size of an electronic instrument using the printed circuit board and it becomes difficult to apply the package to a portable type electronic instrument.

SUMMARY OF THE INVENTION

Accordingly, an object of this invention is to provide a semiconductor device capable of suppressing an increase in the package size caused by an increase in the number of terminals.

Another object of this invention is to provide a semiconductor device capable of suppressing an increase in the cost and weight of a package body and degradation in the electrical characteristics.

Still another object of this invention is to provide a semiconductor device capable of reducing the size of the electronic instrument used and enhancing the mass-productivity of the electronic instruments.

Another object of this invention is to provide a semiconductor device capable of simplifying the visual inspection, enhancing the mass-productivity, and suppressing an increase in the cost.

The above objects can be attained by a semiconductor device comprising a semiconductor chip having at least one semiconductor element formed thereon; a package for receiving the semiconductor chip; and bumps formed on the surface of the package and electrically connected to the semiconductor chip to act as external pins of the package.

Since the bumps formed on the surface of the package are used instead of pins as the external pins, the pitch can be easily reduced and an increase in the package size caused by an increase in the number of terminals can be suppressed. As a result, an increase in the cost and weight of the package body and degradation in the electrical characteristics due to an increase in the wiring length can be suppressed. Further, the bumps will not be bent and suitable to be mounted on the printed circuit board by the surface mounting method, and the size of an electronic instrument using a semiconductor device having the above package can be reduced and the mass-productivity can be enhanced. Since the visual inspection effected when the package is manufactured to check whether or not the arrangement of the bumps satisfy the specification can be simplified, the mass-production can be easily attained and the cost thereof can be reduced also from this point of view.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
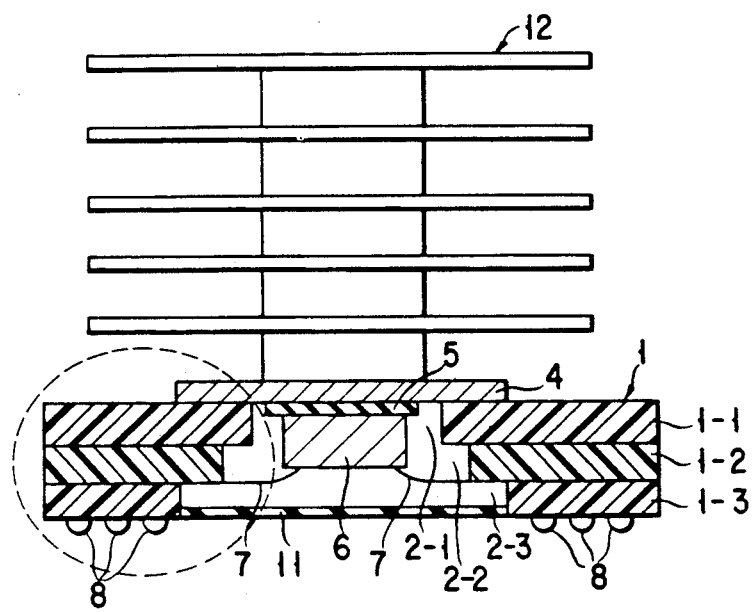
FIG. 1 is a cross sectional view for illustrating a semiconductor device according to a first embodiment of this invention.
Figure 2:
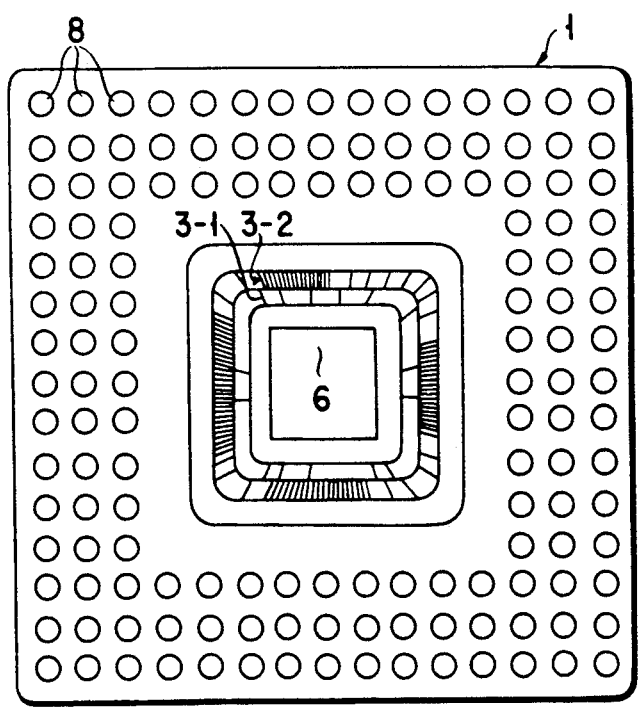
FIG. 2 is a plan view made when viewing the semiconductor device of FIG. 1 from below.
Figure 3:
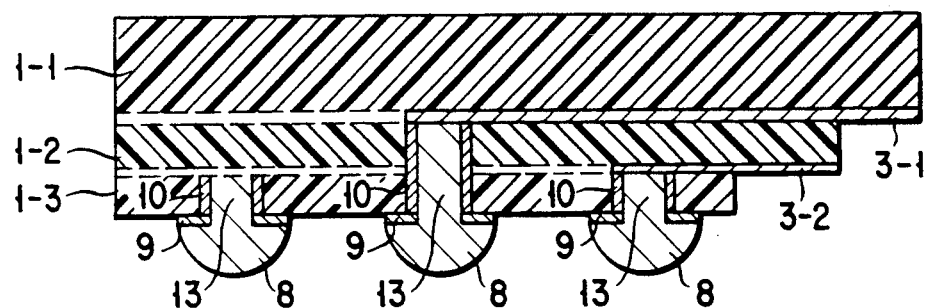
FIG. 3 is a cross sectional view showing an extracted and enlarged portion of a package in the semiconductor device of FIG. 1.

FIGS. 1 to 3 show a semiconductor device according to a first embodiment of this invention. FIG. 1 is a cross sectional view and FIG. 2 is a plan view made when viewing the semiconductor device from below with a lid plate removed. In FIG. 2, bonding wires are omitted for brief explanation. FIG. 3 is a cross sectional view showing an area which is surrounded by broken lines in FIG. 1 and enlarged.

A main body 1 of a package is formed by laminating three laminated insulation plates 1-1, 1-2 and 1-3 (which are formed of ceramic in this example but may be formed of plastic) respectively having windows 2-1, 2-2 and 2-3 in the central portions thereof. As shown in FIG. 3, metallized patterns (for example, Cu foils) 3-1 and 3-2 are respectively formed on the surfaces of the insulation plates 1-1 and 1-2. A metal material such as a Cu alloy which has a high thermal conductivity is used to form an island (heat radiation plate) 4. An insulation plate (which is an aluminum nitride plate, beryllium oxide plate or silicon carbide plate, for example) 5 having a high thermal conductivity and having both surfaces metallized is fixed on the central portion of the rear surface of the island 4. A semiconductor chip 6 having a semiconductor element or elements formed thereon is mounted on the bottom surface of the insulation plate 5 by die bonding. The rear surface of the island 4 is fixed on the package body 1 to close a space of the package body 1 defined by the windows 2-1, 2-2 and 2-3 on the window 2-1 side with the semiconductor chip 6 placed in the space of the package body 1 and the space of the package body 1 on the window 2-3 side is closed by a lid plate 11.

The semiconductor chip 6 placed inside the package body 1 is electrically connected to the metallized patterns 3-1 and 3-2 by means of bonding wires 7. A large number of bumps 8 used as terminals for connection with the exterior are arranged on the rear surface side (bottom surface of the insulation plate 1-3) of the package body 1 in a grid form as shown in FIG. 2. As shown in FIG. 3, through holes 13 are formed in the insulation plates 1-3 and 1-2 and land patterns 9 which are formed of Cu foils, for example, are formed on the surface of the insulation plate 1-3 in those areas which lie around the through holes 13. Conductive films (for example, Au plated films) 10 are formed in the inner surfaces of the respective through holes 13 and the land patterns 9 are electrically connected to the metallized patterns 3-1 and 3- via the respective conductive films 10. The bumps 8 are formed by printing, for example, pasted solder alloys (alloy of Sn and Pb) on the land patterns 9. Thus, the bumps 8 are electrically connected to the semiconductor element formed on the semiconductor chip 6.

A heat radiation fin 12 is formed on the front surface of the island 4. With this structure, even when a high-speed device such as an emitter coupled logic (ECL) chip or gallium arsenide (GaAs) chip having a power consumption of approximately several tens of watts is used as the semiconductor chip 6, a desired heat radiation effect can be obtained.

According to the package of the above structure, since the bumps 8 are used instead of pins as the external pins, the pitch can be easily reduced and an increase in the size of the package can be suppressed even when the number of terminals is increased. Thus, an increase in the cost of the package body and an increase in the weight thereof can be suppressed. Further, an increase in the inductance, capacitance, and resistance components caused by an increase in the wiring length in the package can be suppressed. Therefore, degradation in the electrical characteristic can be suppressed and the operation delay time of the semiconductor device can be reduced. Further, since the package size can be reduced, the distortion amount of the substrate caused when the semiconductor device is mounted on the printed circuit board is small and the rupture strength is high. The bumps will not be bent and are suitable for the mounting by the surface mounting method, and the size of an electronic instrument using the semiconductor device having the above package can be reduced and the mass-productivity can be enhanced. In addition, the visual inspection effected at the time of manufacturing the package to check whether or not the arrangement of the bumps satisfies the specification can be simplified and the rationalization of the manufacturing process can be simplified. As a result, the manufacturing efficiency can be made high, the mass-productivity is high and the cost can be reduced.

In the above embodiment, the package body 1 is formed of the three laminated layers of the insulation plates 1-1, 1-2 and 1-3, but the insulation plates are not limited to the three layers and may be formed of two layers or four or more layers. Further, the metallized patterns 3-1 and 3-2 are formed on the surfaces of the insulation plates 1-1 and 1-2, respectively, but may be formed on the surface of one of the insulation plates, and they may be formed on the surface of at least one of the insulation plates when three or more insulation plates are formed.

Figure 4:
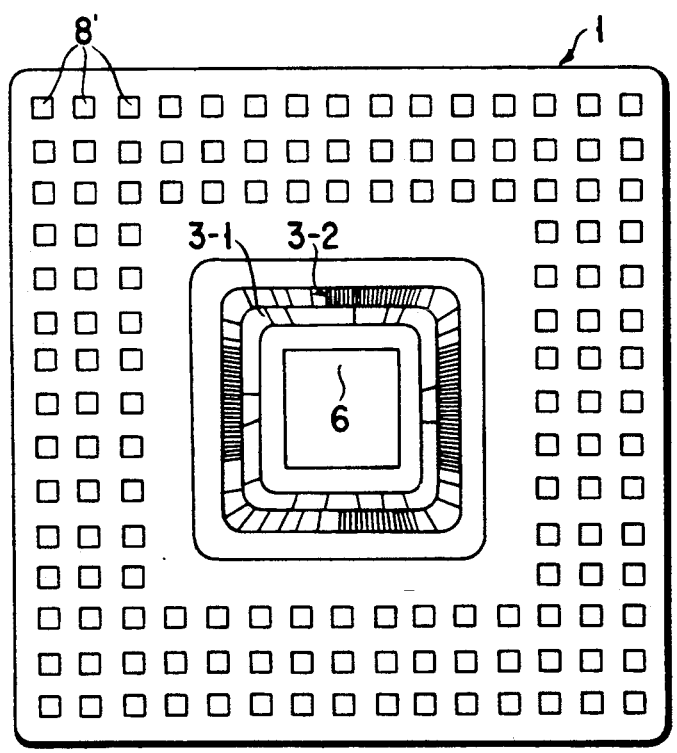
FIG. 4 is a plan view made when viewing a semiconductor device according to a second embodiment of this invention, for illustrating the semiconductor device.

FIG. 4 is a plan view made when viewing the package body 1 of a semiconductor device according to a second embodiment of this invention with the lid plate removed, for illustrating the semiconductor device. As in FIG. 2, bonding wires are omitted also in FIG. 4. As shown in FIG. 4, bumps 8' whose plane shape is square are arranged in a grid form. With the above structure, the pitch can be more easily reduced in this case than when the bumps 8 with a circular plane shape shown in FIG. 1 are used.

As described above, according to this invention, since an increase in the size of the package with an increase in the number of terminals can be suppressed, an increase in the cost and weight of the package body and degradation of the electrical characteristics can be suppressed. Further, the package of this invention is suitable for mounting on the printed circuit board by the surface mounting method and the size of an electronic instrument using the semiconductor device having the package can be reduced and the mass-productivity can be enhanced. In addition, it is suitable for semiconductor devices such as industrial instruments, computers, work stations, or testers, which require the high operation speed.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device comprising:
   a semiconductor chip having at least one semiconductor element formed thereon;
   a package for receiving said semiconductor chip, said package including
      a plurality of laminated insulation plates respectively having windows formed therein,
      metallized patterns formed on the surface of at least one of said insulation plates,
      through hole passages formed in at least one of said insulation plates,
      conductive films formed on inner surfaces of said through hole passages to be electrically connected to said metallized patterns, and
      land patterns formed on one of said insulation plates which has an exposed surface and being electrically connected to said conductive films; and
   bumps formed on the surface of said package and being electrically connected to said semiconductor chip, said bumps being used as external terminals of said package and being formed in said through hole passages whose inner surfaces are covered with said conductive films to project from said through hole passages, and said semiconductor chip being received in a space defined by the windows of said plurality of insulation plates.

2. The semiconductor device according to claim 1, further comprising bonding wires for electrically connecting said semiconductor chip to said metallized patterns.

3. The semiconductor device according to claim 1, wherein said bumps are formed of solder alloy.

4. The conductor device according to claim 1, wherein the plane shape of said bumps is one of a circle and a square.

5. The semiconductor device according to claim 1, wherein said bumps are arranged in a grid form on the surface of said package.

6. The semiconductor device according to claim 1, wherein said bumps are bonded to wiring patterns formed on a printed circuit board.

7. The semiconductor device according to claim 1, further comprising a heat radiation fin formed on said package.

* * * * *

UNITED STATES PATENT AND TRADEMARK OFFICE
CERTIFICATE OF CORRECTION

PATENT NO. : 5,191,511
DATED : March 02, 1993
INVENTOR(S) : Hiromichi Sawaya

It is certified that error appears in the above-indentified patent and that said Letters Patent is hereby corrected as shown below:

Claim 4, column 6, line 12, change "conductor" to --semiconductor--.

Signed and Sealed this

Fourteenth Day of December, 1993

Attest:

BRUCE LEHMAN

Attesting Officer     Commissioner of Patents and Trademarks